United States Patent [19]
Bonnot

[11] Patent Number: 5,432,830
[45] Date of Patent: Jul. 11, 1995

[54] HIGH SPEED COUNTER FOR ALTERNATIVE UP/DOWN COUNTING OF PULSE TRAINS AND METHOD THEREFOR

[75] Inventor: Jean-Louis Bonnot, Voreppe, France

[73] Assignee: SGS-Thomson Microelectronics S.A., Gentilly, France

[21] Appl. No.: 156,170

[22] Filed: Nov. 22, 1993

[30] Foreign Application Priority Data

Nov. 24, 1992 [FR] France ................. 92 14477

[51] Int. Cl.⁶ ............................................. H03K 21/02
[52] U.S. Cl. .......................................... 377/41; 377/55; 377/107; 377/119
[58] Field of Search ................ 377/41, 44, 123, 125, 377/119, 107, 55

[56] References Cited

U.S. PATENT DOCUMENTS

| | | | |
|---|---|---|---|
| 2,823,856 | 2/1958 | Booth et al. | 377/41 |
| 3,011,705 | 12/1961 | DeMong | 377/125 |
| 3,906,195 | 9/1975 | Maejima | 377/41 |
| 4,870,664 | 9/1989 | Hayashi | 377/44 |
| 5,146,479 | 9/1992 | Okada | 377/41 |

OTHER PUBLICATIONS

Boukreev et al., "Circuits Micro-electoniques et Technique Numerique", 1975, Mir, Moscou (SU).

*Primary Examiner*—John S. Heyman
*Attorney, Agent, or Firm*—Wolf, Greenfield & Sacks

[57] ABSTRACT

An asynchronous counter includes a plurality of flip-flops, cascade connected to one another, the plurality of flip-flops serially receiving successive pulse trains having varying numbers of pulses per pulse train. Switching circuitry, coupled to the plurality of flip-flops, inverts the state of each flip-flop between a first set of pulse trains and a second set of pulse trains (or first and second consecutive pulse trains) so that the counter computes a difference between the number of pulses in the first set of pulse trains and the number of pulses in the second set of pulse trains (or a difference between the number of pulses of the first pulse train and the number of the second pulse train). Initialization circuitry, coupled to the plurality of flip-flops, initializes all of the flip-flops at each predetermined even number of pulse trains.

20 Claims, 3 Drawing Sheets

HIGH SPEED COUNTER FOR ALTERNATIVE UP/DOWN COUNTING OF PULSE TRAINS AND METHOD THEREFOR

BACKGROUND OF THE INVENTION

1. Field of the Invention

The present invention relates to up/down counters and more particularly to an up/down counter to alternatively count up then count down pulses of successive pulse trains.

2. Discussion of the Related Art

FIG. 1 schematically represents four pulse trains of a signal B. Signal B is applied to the counting input of a conventional up/down counter. Such an up/down counter conventionally has an input U/D for switching the counter to up counting or down counting mode. FIG. 1 also represents the waveform of a signal U/D, for example, to count up pulses of trains of an odd rank and to count down pulses of trains of an even rank. The state of signal U/D switches at each end of a pulse train. More generally, signal U/D could switch at any time between two pulse trains.

Such a counting mode allows, for example, for determining the difference in width of two successive low frequency pulses by observing and resetting the content of the up/down counter at each even number of low frequency pulses. To obtain signal B, a high frequency clock signal and low frequency pulses to be measured are combined in a logic gate. Of course, the up/down counter must operate at the high frequency clock signal. The architecture of conventional up/down counters is synchronous, that is, such counters include a plurality of flip-flops, that are all controlled by a counting signal. The fact that the state of a flip-flop is changed or unchanged during a counting signal pulse is defined by peripheral logic circuits. In a first type of conventional synchronous up/down counter, for example, such as the counter referenced SN74HC191 of Texas Instruments, the peripheral logic circuits include, for each flip-flop of rank N, a Logic gate with N-1 inputs. In CMOS technology, the duration of the switching depends on the square of the number of inputs. The switching of any of such multi-input gate determines the change of state of the corresponding flip-flop. Thus, the maximum frequency of this type of up/down counter is limited by the switching time of the gate having the higher number of inputs (N-1).

FIG. 2 represents an alternative architecture of a synchronous up/down counter. The up/down counter is represented in a count-down configuration. Such bit up/down counter is comprised of N identical cascade-connected cells. Each cell includes a D-type flip-flop 10, a 2-input Exclusive NOR gate 12, and a 2-input AND gate that is conventionally formed by an NAND gate 14 followed by an inverter 15. Flip-flop 10 is connected to a counting line CK that is common to all of the flip-flops. The output of the Exclusive NOR gate 12 is connected to the data input D of the flip-flop. The two inputs of the NOR gate 12 are connected in parallel with two inputs of the NAND gate 14. The output of gate 14/15 provides a carry signal C ($C_0$, $C_1$, $C_2$...) to one of the common inputs of gates 12 and 14 of the cell of the higher rank. For the cell of the first rank, this common input receives a "1". The second common input of gates 12 and 14 is connected to the inverted output Q* of flip-flop 10.

In counting mode, as represented in dotted lines in FIG. 2, the output of the Exclusive NOR gate 12 is connected to the data input D of the flip-flop through an inverter 16; the non-inverted output Q is connected to this second common input; the Q outputs of the flip-flops determine the state of the counter.

The description of the operation of the circuit of FIG. 2 is not useful to the present disclosure: however, it should be reminded that in some cases, the "1" present at the input of the first gate 14 must be transmitted to the last gate 14 before the arrival of the next pulse on line CK. This occurs, for example, in counting down mode, when the state of the counter goes from state 1000... to state 0111... Thus, the counting frequency of such a counter is limited by 2(N-1) switching times of the gate for an N-bit counter.

In practice, the architecture of FIG. 2 is faster than the architecture of counter SN74HC191 for a large number of bits. In a conventional CMOS technology, a 10-bit counter implementing this architecture has a limit frequency of approximately 42 MHz.

FIG. 3 represents a conventional architecture of an asynchronous counter. Such a counter includes a plurality of cascade-connected D-type flip-flops. The clock input of each flip-flop is connected to the non-inverted output Q of the preceding flip-flop, and the clock input of the first flip-flop receives the counting signal CK. Each flip-flop is connected according to a divider by 2 configuration, i.e., the inverted output Q* of the flip-flop is connected to the data input D of the flip-flop. With this configuration, when a flip-flop receives an active edge, generally a rising edge, at its clock input, it memorizes the state of its inverted output Q*, i.e., the content of the flip-flop is inverted. In such a counter, whose flip-flops are enabled by rising edges, if the non-inverted outputs Q are selected as output, the counter counts down; if the inverted outputs Q* are selected as output, the counter counts up.

The advantage of an asynchronous counter such as the counter of FIG. 3 is that its limit frequency is the limit frequency of the first flip-flop. In conventional CMOS technology, a D-type flip-flop has a limit frequency of approximately 100 MHz.

However, an asynchronous counter does not allow, for example, to count up to a predetermined value, then to count down from this value. Therefore, such a counter cannot be used directly to count up and to count down successive pulse trains.

SUMMARY OF THE INVENTION

An object of the invention is to provide an asynchronous counter structure for counting up and counting down successive pulse trains occurring at a high frequency.

This object is achieved with an asynchronous counter including a plurality of flip-flops connected in cascade according to increasing ranks, receiving pulse trains, and including means for inverting the state of each flip-flop between two pulse trains, and for resetting all the flip-flops at each even number of pulse trains.

According to an embodiment of the invention, the inversion means includes a switch connecting each clock input, either to the output of the flip-flop of the previous rank during the occurrence of a pulse train, or to a line providing a switch pulse during each time interval separating two pulse trains.

According to an embodiment of the invention, each flip-flop includes a set input receiving a set pulse after each even number of switching pulses.

According to an embodiment of the invention, each flip-flop includes an inverted output connected to a latch enabled by the set pulse.

According to an embodiment of the invention, the switches are controlled by a signal that is active during the time intervals separating two pulse trains, and delay means for delaying this signal from a switch to the switch of the flip-flop of next rank.

According to an embodiment of the invention, the number of flip-flops is selected so that the maximum binary absolute value that can be contained in the counter is higher than twice the maximum difference of the number of pulses of two successive pulse trains.

The foregoing and other objects, features, aspects and advantages of the invention will become apparent from the following detailed description of the present invention when taken in conjunction with the accompanying drawings.

DETAILED DESCRIPTION

The present invention proposes, in order to count up and count down successive pulse trains, instead of using a conventional up/down counter and switching its mode between each pulse train, to use an asynchronous counter and to invert the state of each of its flip-flops between each pulse train.

It is assumed that the asynchronous counter can count up to a maximum number n, that a first pulse train includes i pulses, and that a second pulse train includes j pulses. The counter, that is previously reset, counts from 0 to i during the first pulse train. The states of the counter's flip-flops are then inverted, thus causing the complementation to n of value i; the counter then contains the value n−i. During the second pulse train, the counter counts from n−i to n−i+j. The desired difference is i−j. Value i−j is the complement to n of n−i+j that is obtained by reinverting the states of the flip-flops.

The counter may overflow for example because i is higher than n. Once the counter has counted up to n, it continues counting, restarting from 0. As will be seen with reference to FIG. 6, difference i−j is correctly determined provided that it is not higher than n. Therefore, the number of bits of the counter is selected so that value n is higher than the highest possible value of difference i−j.

Figure 1:
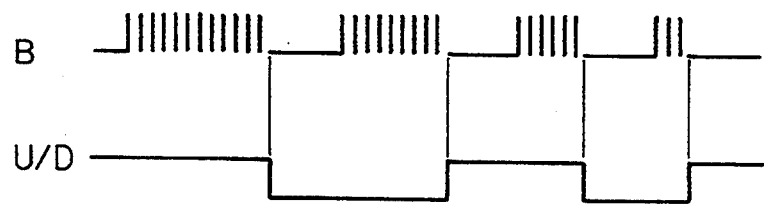
FIG. 1, above described, represents pulse trains that are to be successively counted up and counted down.
Figure 2:
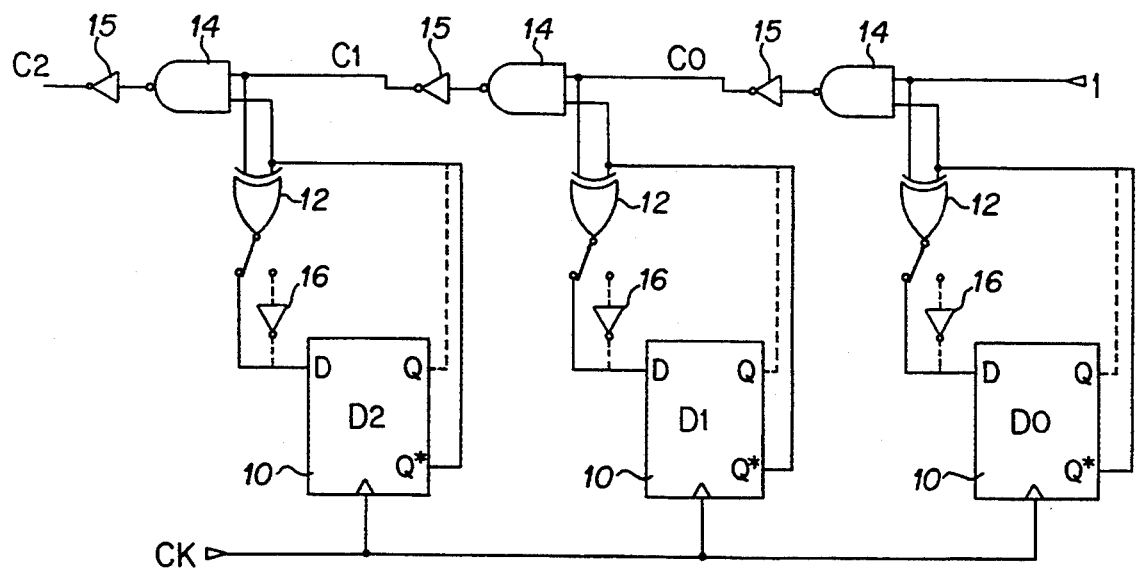
FIG. 2 represents a conventional structure of a synchronous up/down counter.
Figure 3:
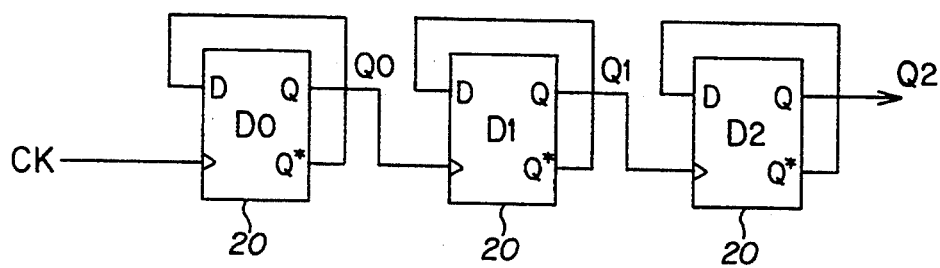
FIG. 3 represents a conventional structure of an asynchronous counter.
Figure 4:
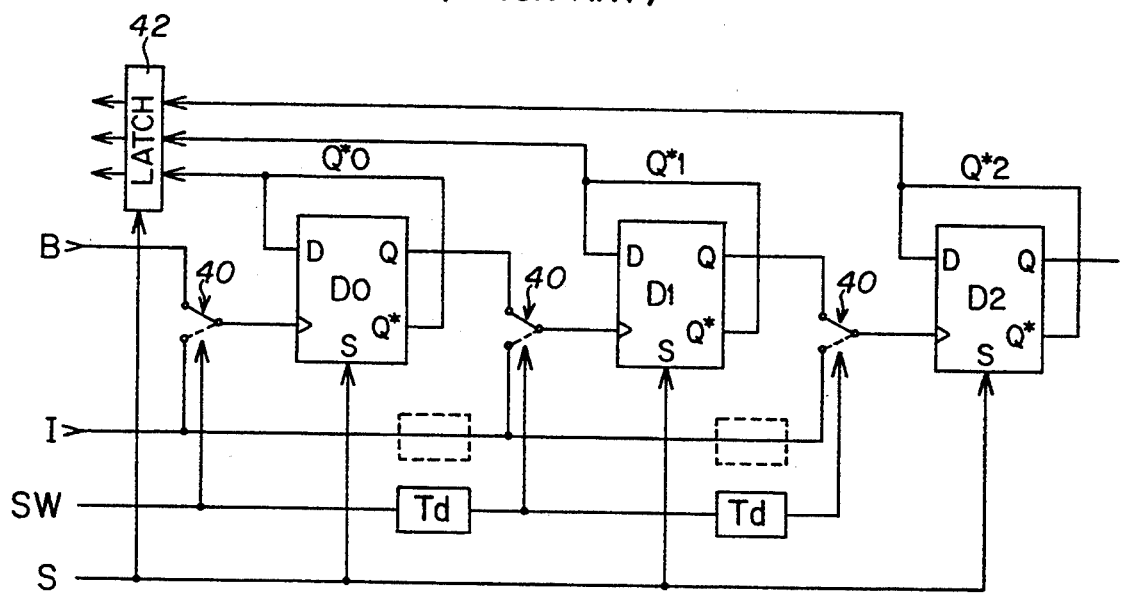
FIG. 4 represents an embodiment of an asynchronous counter structure according to the invention for counting up and counting down successive pulse trains.

The basic structure of the counter of FIG. 4 is similar to the structure of the asynchronous counter of FIG. 3. The counter of FIG. 4 includes a plurality of cascade-connected D-type flip-flops (D0, D1, D2, . . . ). The inverted output Q* of each flip-flop is connected to the data input D of the flip-flop.

According to the invention, the clock input of each flip-flop is either connected to the non-inverted output Q of the preceding flip-flop or to a common line I through a switch 40 that is controlled by a common line SW. The first switch 40 receives the pulse trains B instead of the output Q of a flip-flop. Each flip-flop also includes a set input S connected to a common line S. The flip-flop outputs taken into account are the inverted outputs Q* that can also be connected to a latch 42 controlled by signal S. The components Td are delay circuits whose function will be described hereinafter.

Figure 5:
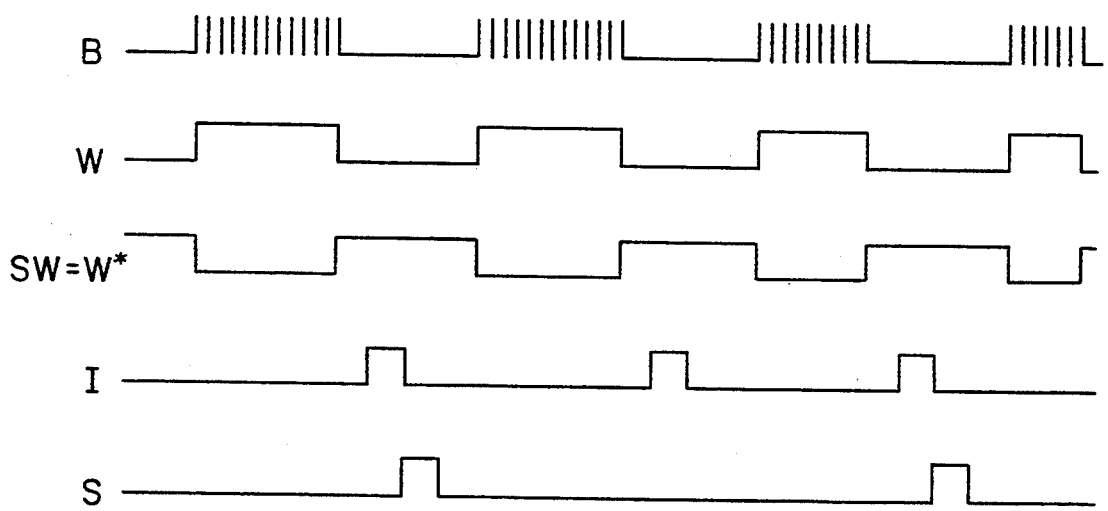
FIG. 5 represents the waveforms of signals used by the counter of FIG. 4.

FIG. 5 illustrates the operation of the counter of FIG. 4, and shows four pulse trains of a signal B applied to the counter input. In a circuit operable for providing pulse train B, there is also generally provided a window signal W that provides for supplying signal B by combining the window signal W with a high frequency clock signal through an AND gate, for example. In this case, signal W is at "1" during the pulse trains and at "0" during the time intervals between the pulse trains. Signal SW controlling switches 40 is, for example, the logic inverse W* of signal W. In all cases, signal SW is such that the switches 40 connect the D-type flip-flops in cascade mode according to the configuration of FIG. 3 at least during the pulse trains, and connect the clock inputs of the flip-flops to line I during at least a portion of the time interval during the occurrence of pulse trains.

While the clock inputs of the flip-flops are connected to line I, a pulse is provided to line I. Then, as described with reference to FIG. 3, the state of each flip-flop is inverted. Additionally, the flip-flops are set again after each even number of the inverting pulses I, for example as shown in FIG. 5, after each second pulse I by a pulse S. It will be seen with reference to FIG. 6 that through this operation, all the outputs Q* of the flip-flops provide, at each second pulse I, the difference of the numbers of pulses of the two preceding trains. The successive differences, if any, are stored in latch 42 at each pulse S. Pulses S are in fact set pulses that reset the inverted outputs Q*.

Those skilled in the art are capable of generating pulses I and S using various conventional and simple circuits. For example, pulses I can be obtained by delaying signal SW twice, and by combining, with an AND gate, the signal delayed once with the reverse signal delayed twice. Pulses S can be obtained by dividing signal P by 2 and by combining in an AND gate this halved signal with its delayed inverted signal.

Figure 6:
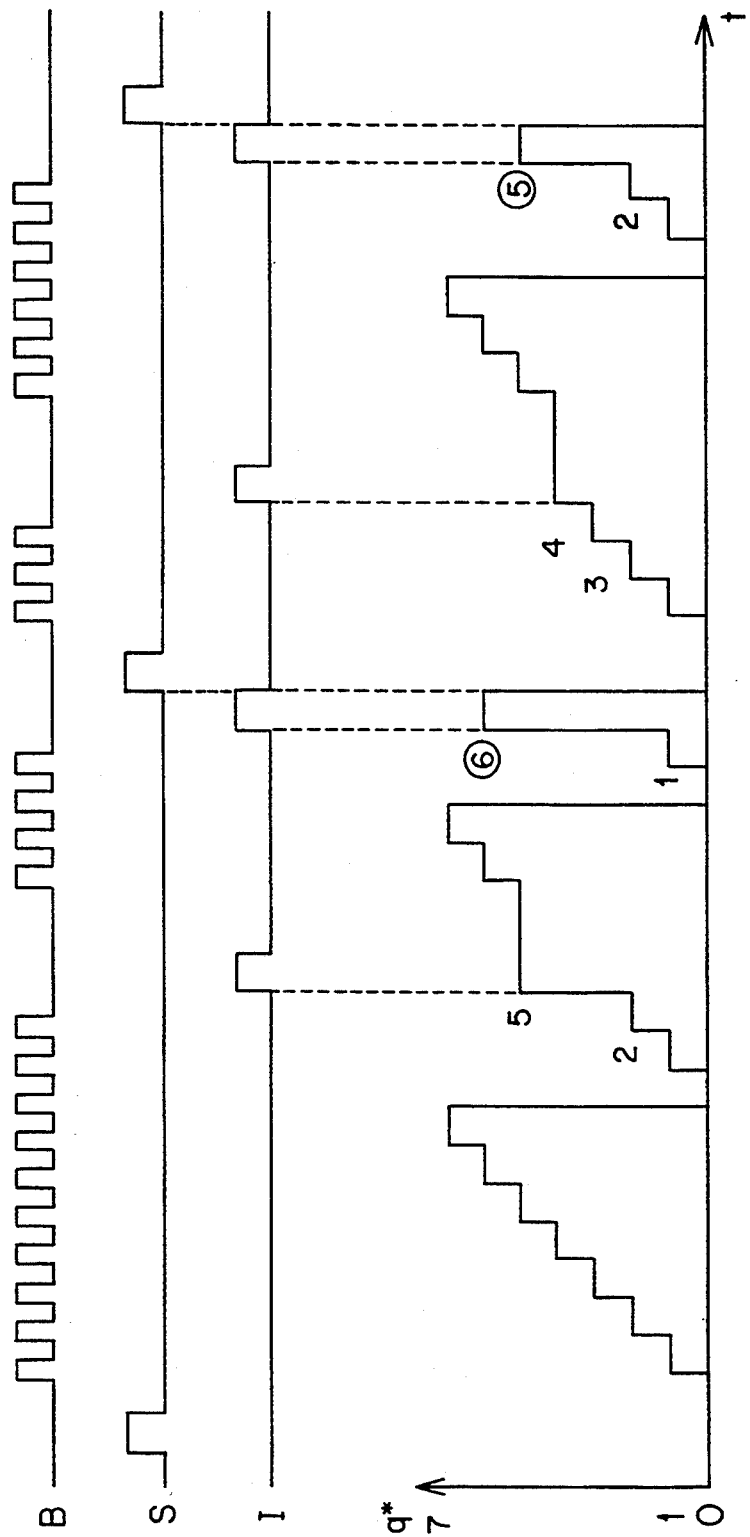
FIG. 6 illustrates the operation of the counter of FIG. 4 in two specific applications.

FIG. 6 illustrates with numerical examples the operation of the counter of FIG. 4 in two possible overflow cases. Signal B is represented as comprising four pulse trains of 10, 4, 3 and 6 pulses, respectively. A set pulse S, setting to "1" outputs Q, and therefore resetting outputs Q* is provided before the first pulse train and before the third pulse train. The inversion pulses I are provided after each pulse train and, possibly, before the set pulses S. FIG. 6 shows the decimal value, q* defined by the assembly of outputs Q* of the flip-flops of FIG. 4 when a 3-flip-flop counter, i.e. a 3-bit counter, that can count up from the binary value 000 (decimal value 0) to the binary value 111 (decimal value 7), is used. With the preceding notation, n=7. Since the value defined by the assembly of outputs Q of the flip-flops is the complement to 7 of value q* the evolutions of value q* only will be described.

At the first pulse S, value q* is forced to 0. At each pulse of the first 10-pulse train, value q* is incremented. At the eighth pulse of the first train, the counter overflows and value q* goes to 0. At the end of this train, q*=2 (010 in binary). Then, the first inversion pulse I occurs, thus causing complementation to 7 of value q* Value q* goes to 7−2=5 (101 in binary).

At each pulse of the second 4-pulse train, q* is incremented from value 5. At the third pulse of the second train, the counter overflows and q* goes to 0. At the end of this train, q*=1. When the second pulse I subsequently occurs, q*=7−1=6. Value q*=6 thus represents the difference (10−4) of the number of pulses of the first and second trains. The fact that the number of pulses (10) of the first train was higher than the counter capacity (7) does not impair the result.

When, the second set pulse S occurs, thus forcing value q* to "0" and memorizes value q*=6 that was previously obtained in latch 42.

The cycle is then resumed for the third 3-pulse and fourth 6-pulse trains. At the end of the third pulse train, q*=3. The third pulse I occurs and value q* goes to 7−3=4. The counter counts the pulses of the fourth train from value 4 and overflows at the fourth pulse. Value q* goes to 0. At the end of the fourth pulse train, q*=2. During the subsequent pulse I, value q* goes to 7-2=5. This value is equal to the desired difference modulo 8 (5=−3 mod 8). However, in this example, it is not possible to differentiate the positive difference 6 from the negative difference −3.

To avoid this ambiguity, the invention proposes to use a counter including an additional bit, i.e., in the present example, a counter capable of counting up to 15. Then, the result of the counting of the first and second pulse trains is still 6. But, the result of the counting of the third and fourth pulse trains is −3 mod 16=13. Since it is known that the possible differences do not exceed 7 pulses, it is possible to differentiate a positive difference from a negative difference due to the fact that a negative difference corresponds to a counting result comprised between 8 and 15. In binary mode, the additional bit of the counter indicates by "1" a negative value and by "0" a positive value. Thus, a logic circuit can adequately process the results provided by the counter. Some circuits, such as a conventional adder, can also directly exploit this type of result.

Generally, the number of bits of the counter is selected so that the counter can count at least up to twice the absolute value of the maximum difference of the numbers of pulses of two successive pulse trains.

In the above description, switching delays of the flip-flops are neglected. It would be impairing to switch a switch 40 to line I when the state Q of the preceding flip-flop had not time enough to change. To avoid this drawback, in FIG. 4 is shown a delay circuit Td arranged on line SW between two successive switches 40. The delay introduced by a circuit Td is higher than or equal to the switching of a flip-flop. In this case, it is ascertained that a switch 40 is switched while the preceding flip-flop had time enough to change its stake. If there is a risk that the delays introduced by circuits Td may be higher than the time interval separating an inversion pulse I from the end of a pulse train, it is also possible to introduce delay circuits in line I between switches 40, as represented by rectangles drawn in dotted lines.

As is apparent to those skilled in the art, various modifications can be made to the invention as above disclosed, in particular as regards the implementation of switches 40 and the generation of pulses I and S. In the above description, a pulse S, generated every two pulses I, is disclosed. The generation of a pulse S at each arbitrary even number of pulses I can be devised to obtain the sum of the differences of the numbers of pulses of the preceding pulse trains.

Having thus described one particular embodiment of the invention, various alterations, modifications; and improvements will readily occur to those skilled in the art. Such alterations, modifications, and improvements are intended to be part of this disclosure, and are intended to be within the spirit and scope of the invention. Accordingly, the foregoing description is by way of example only and is not intended as limiting. The invention is limited only as defined in the following claims and the equivalents thereto.

What is claimed is:

1. An asynchronous counter comprising:
a plurality of flip-flops, connected in cascade to one another, the plurality of flip-flops serially receiving successive pulse trains having varying numbers of pulses per pulse trains;
means, coupled to the plurality of flip-flops, for inverting a state of each flip-flop between first and second consecutive pulse trains so that the counter computes a difference between the number of pulses of the first pulse train and the number of pulses of the second pulse train; and
means, coupled to the plurality of flip-flops, for initializing all of the flip-flops at each predetermined even number of pulse trains.

2. The counter as claimed in claim 1 wherein each of the flip-flops includes a clock input and an output.

3. The counter as claimed in claim 2 wherein the means for inverting includes a switch connecting each clock input to an output of a previous flip-flop during an occurence of a pulse train and connecting each clock input to a line providing a switch pulse during each time interval separating two pulse trains.

4. The counter as claimed in claim 3 wherein each flip-flop includes a set input receiving an initializing pulse after each even number of switch pulses.

5. The counter as claimed in claim 4 further comprising a latch, coupled to the plurality of flip-flops, the latch being enabled by the initializing pulse, wherein each flip-flop includes an inverted output connected to the latch.

6. The counter as claimed in claim 3 wherein the means for inverting includes a plurality of switches, wherein the switches are controlled by a switching signal that is active during time invervals separating two pulse trains, and further comprising delay means, coupled to the plurality of flip-flops, for delaying the switching signal from a switch of one flip-flop to a switch of a subsequent flip-flop.

7. The counter as claimed in claim 1 wherein a number of flip-flops is selected so that a maximum binary absolute value that can be obtained in the counter is higher than twice that of a maximum difference of a number of pulses of two successive pulse trains.

8. An asynchronous counter comprising:
a plurality of flip-flops, cascade connected to one another, the plurality of flip-flops serially receiving successive pulse trains having varying numbers of pulses per pulse train;
switching circuitry, coupled to the plurality of flip-flops, inverting the state of each flip-flop between a first set of pulse trains and a second set of pulse trains so that the counter computes a difference between the number of pulses of the first set of pulse trains and the number of pulses of the second set of pulses trains; and initialization circuitry, coupled to the plurality of flip-flops, initializing all of the flip-flops at each predetermined even number of pulse trains.

9. The counter of claim 8 wherein each of the flip-flops includes a clock input and an output.

10. The counter of claim 9 wherein the switching circuitry includes a switch coupling each clock input to an output of a previous flip-flop during an occurence of a pulse train and to a line providing a switch pulse during each time interval separating two pulse trains.

11. The counter of claim 10 wherein each flip-flop includes a set of inputs receiving an initialization pulse after each even number of switch pulses.

12. The counter of claim 11 wherein the initialization circuitry provides each initialization pulse to the flip-flops.

13. The counter of claim 12 further comprising a latch, coupled to the plurality of flip-flops, storing an inverted output of the flip-flops.

14. The counter of claim 13 wherein each flip-flop includes an inverted output coupling to the latch.

15. The counter of claim 14 wherein the switching circuitry includes a plurality of switches controlled by a switching signal that is active during time intervals separating two pulse trains.

16. The counter of claim 15 further comprising delay circuitry, coupled to the plurality of flip-flops, delaying the switching signal from a switch of one flip-flop to a switch of a subsequent flip-flop.

17. The counter of claim 8 wherein a number of flip-flops is selected so that a maximum binary absolute value that can be obtained in the counter is higher than twice that of a maximum difference of a number of pulses of two successive pulse trains.

18. A method for computing a difference between pulses of successive pulse trains comprising the steps of:

serially receiving successive pulse trains having varying number of pulses per pulse train;

providing the pulse trains to a plurality of flip-flops that are cascade-connected to one another;

inverting the state of each flip-flop between two successive pulse trains so that the counter computes a difference in the number of pulses of the successive pulse trains; and initializing each flip-flop at each predetermined even number of the pulse trains.

19. A method as claimed in claim 18 further comprising the step of coupling each clock input of a flip-flop to an output of a previous flip-flop during an occurrence of a pulse train and to a line providing a switch pulse during each time interval separating two pulse trains.

20. A method as claimed in claim 19 further comprising the step of selecting a number of flip-flops so that a maximum binary absolute value counted to is higher than twice that of a maximum difference of a number of pulses of two successive pulse trains.

* * * * *